United States Patent
Yasuda

(10) Patent No.: US 12,342,634 B2
(45) Date of Patent: Jun. 24, 2025

(54) PHOTODETECTOR

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Kensuke Yasuda, Kitakami Iwate (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 373 days.

(21) Appl. No.: 17/891,799

(22) Filed: Aug. 19, 2022

(65) Prior Publication Data
US 2023/0307571 A1   Sep. 28, 2023

(30) Foreign Application Priority Data
Mar. 24, 2022   (JP) .................. 2022-049038

(51) Int. Cl.
*H10F 30/225*   (2025.01)
*H10F 39/10*    (2025.01)

(52) U.S. Cl.
CPC ......... *H10F 30/225* (2025.01); *H10F 39/107* (2025.01)

(58) Field of Classification Search
CPC . H01L 31/107; H01L 27/1446; H10F 30/225; H10F 39/107
See application file for complete search history.

(56) References Cited

U.S. PATENT DOCUMENTS

2011/0220976 A1   9/2011   Iida et al.
2015/0083211 A1   3/2015   Fujimoto et al.
(Continued)

FOREIGN PATENT DOCUMENTS

JP   2010-067676 A   3/2010
JP   2011187857 A    9/2011
(Continued)

OTHER PUBLICATIONS

Mudachathi, R., et al., "Up Scalable Full Colour Plasmonic Pixels with Controllable Hue, Brightness and Saturation", Scientific Reports 7, Article No. 1199, Apr. 26, 2017, URL: https://doi.org/10.1038/s41598-017-01266-6, 10 pages.
(Continued)

*Primary Examiner* — Georgia Y Epps
*Assistant Examiner* — Don J Williams
(74) *Attorney, Agent, or Firm* — Kim & Stewart LLP

(57) ABSTRACT

A photodetector according to an embodiment includes a plurality of cell regions disposed in an array, and an element isolation region provided between the cell regions, each of the cell regions including: a semiconductor layer having a first face and a second face opposite to the first face; a first semiconductor region of a first conductivity type provided in the semiconductor layer; a second semiconductor region of a second conductivity type provided between the first semiconductor region and the first face; an electrode in contact with the second semiconductor region; and a plurality of metal regions having a part surrounded by the first semiconductor region and another part surrounded by the second semiconductor region.

10 Claims, 15 Drawing Sheets

(56) References Cited

U.S. PATENT DOCUMENTS

| | | | |
|---|---|---|---|
| 2019/0074396 A1 | | 3/2019 | Dong et al. |
| 2021/0043669 A1* | | 2/2021 | Kokubun .......... H01L 27/14612 |
| 2021/0134862 A1 | | 5/2021 | Ishida et al. |
| 2021/0273120 A1 | | 9/2021 | Zang et al. |
| 2021/0296381 A1 | | 9/2021 | Atsuta et al. |

FOREIGN PATENT DOCUMENTS

| | | |
|---|---|---|
| JP | 2015-061064 A | 3/2015 |
| JP | 2016-174076 A | 9/2016 |
| JP | 2019047016 A | 3/2019 |
| JP | 2019075463 A | 5/2019 |
| JP | 2021027192 A | 2/2021 |
| JP | 2021150359 A | 9/2021 |
| WO | 2018021411 A1 | 2/2018 |

OTHER PUBLICATIONS

Cushing, S. K., et al., "Plasmon-Enhanced Solar Energy Harvesting", The Electrochemical Society Interface, vol. 22, No. 2, 2013, 6 pages.

Notice of Reasons for Refusal (Office Action) dated Feb. 4, 2025 in corresponding Japanese Patent Application No. 2022-049038 with English Translation (11 pages).

* cited by examiner

PHOTODETECTOR

CROSS-REFERENCE TO RELATED APPLICATION

This application is based upon and claims the benefit of priority from Japanese Patent Application No. 2022-049038, filed on Mar. 24, 2022, the entire contents of which are incorporated herein by reference.

FIELD

Embodiments described herein relate generally to a photodetector.

BACKGROUND

As a photodetector that detects weak light, a silicon photomultiplier (SiPM) has been developed which has a plurality of cell regions disposed in an array, each of the cell regions including an avalanche photodiode (APD). The SiPM has high detection sensitivity capable of detecting one incident photon.

On the other hand, the SiPM has a problem of suppressing generation of noise because of high detection sensitivity. The noise to be suppressed includes crosstalk noise and delay noise.

Crosstalk noise is generated, for example, when a secondary photon generated by an electron avalanche enters an adjacent cell region. Delay noise occurs when carriers generated in a cell region cause an electron avalanche after a lapse of time.

DETAILED DESCRIPTION

Figure 1:
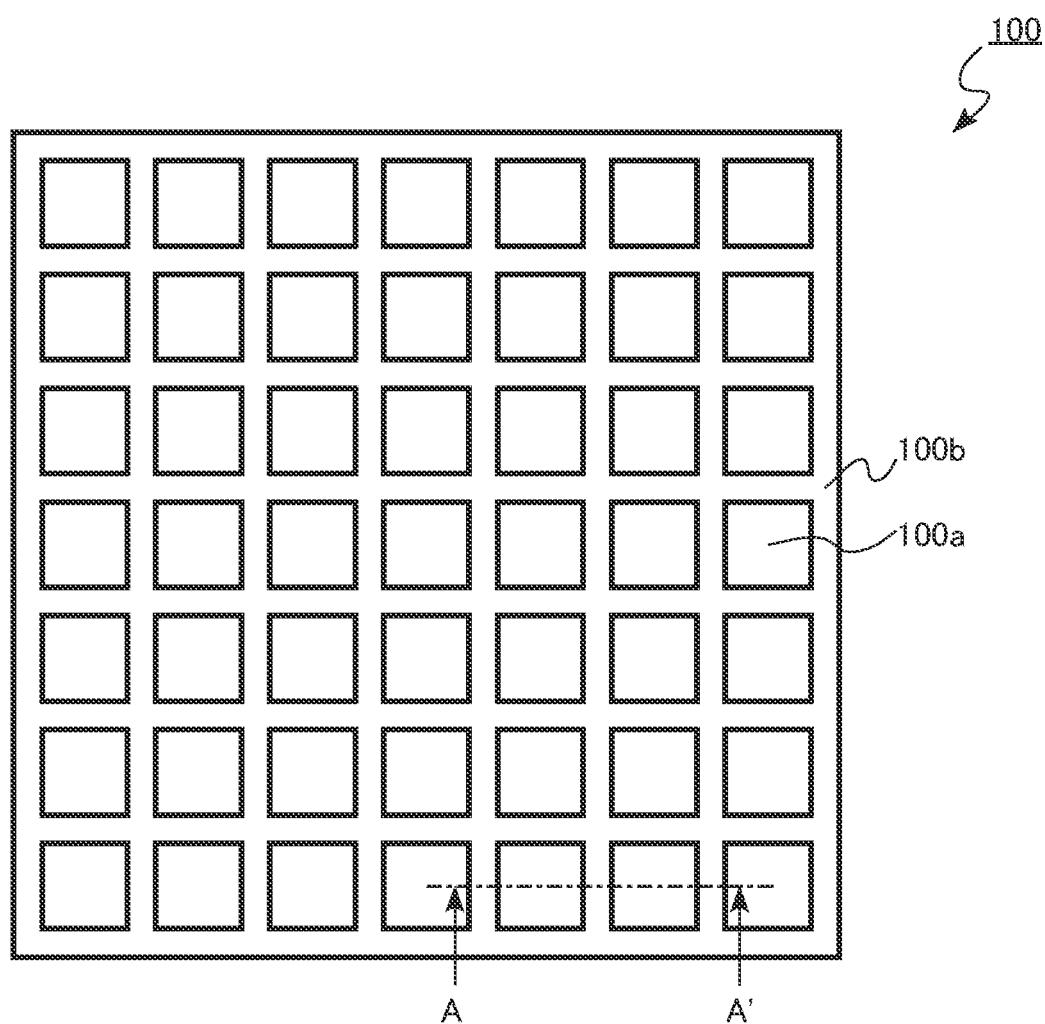
FIG. 1 is a schematic top view of a photodetector according to a first embodiment.

A photodetector according to one aspect of the present disclosure includes a plurality of cell regions disposed in an array, and an element isolation region provided between the cell regions, each of the cell regions including: a semiconductor layer having a first face and a second face opposite to the first face; a first semiconductor region of a first conductivity type provided in the semiconductor layer; a second semiconductor region of a second conductivity type provided between the first semiconductor region and the first face; an electrode in contact with the second semiconductor region; and a plurality of metal regions having a part surrounded by the first semiconductor region and another part surrounded by the second semiconductor region.

In the present specification, the same or similar components are denoted by the same reference numerals, and redundant description may be omitted.

In the present specification, in order to indicate a positional relationship of components and the like, an upward direction in the drawings may be described by the term "upper", and a downward direction in the drawings may be described by the term "lower". In the present specification, the concepts of "upper" and "lower" are not necessarily terms indicating the relationship with the direction of gravity.

When the present specification includes wordings of $n^+$ type, n type, and $n^-$ type, it means that the concentration of n-type impurities decreases in the order of the $n^+$ type, the n type, and the $n^-$ type. Further, when the present specification includes wordings of $p^+$ type, p type, and $p^-$ type, it means that the concentration of p-type, impurities decreases in the order of the $p^+$ type, the p type, and the $p^-$ type.

In the present specification, the distribution and absolute value of the impurity concentration in the semiconductor region can be measured using, for example, secondary ion mass spectrometry (SIMS). In addition, the relative magnitude relationship between the impurity concentrations of the two semiconductor regions can be determined using, for example, scanning capacitance microscopy (SCM).

Qualitative analysis and quantitative analysis of chemical compositions of components constituting the photodetector in the present specification can be performed by, for example, SIMS and energy dispersive X-ray spectroscopy (EDX). In addition, a transmission electron microscope (TEM) can be used to measure the thickness of the components constituting the photodetector, the distance between the components, and the like, for example. In addition, a substance of components constituting the photodetector can be identified using, for example, X-ray diffraction (XRD), electron beam diffraction (EBD), or X-ray photoelectron spectroscopy (XPS).

First Embodiment

A photodetector according to the first embodiment includes a plurality of cell regions disposed in an array, and an element isolation region provided between the cell regions, each of the cell regions including: a semiconductor layer having a first face and a second face opposite to the first face; a first semiconductor region of a first conductivity type provided in the semiconductor layer; a second semiconductor region of a second conductivity type provided between the first semiconductor region and the first face; an electrode in contact with the second semiconductor region; and a plurality of metal regions having a part surrounded by the first semiconductor region and another part surrounded by the second semiconductor region.

In the following, a case where the first conductivity type is p-type and the second conductivity type is n-type will be described as an example.

FIG. 1 is a schematic top view of a photodetector according to the first embodiment.

As illustrated in FIG. 1, a photodetector 100 includes a cell region 100a and an element isolation region 100b. A plurality of cell regions 100a is disposed in an array. One APD is provided in each cell region 100a.

In FIG. 1, the number of cell regions 100a disposed in an array is 49, but the number of cell regions 100a is not particularly limited. The number of cell regions 100a is, for example, equal to or more than 10 and equal to or less than 1000.

The shape of each cell region 100a is, for example, a rectangle when viewed from above. The shape of each cell region 100a is, for example, a square when viewed from above. The length of one side of each cell region 100a is, for example, equal to or more than 10 μm and equal to or less than 100 μm.

The element isolation region 100b is provided between the cell regions 100a. The element isolation region 100b surrounds each cell region 100a. The element isolation region 100b has a function of electrically isolating the cell region 100a and the cell region 100a, which are adjacent to each other, from each other.

Figure 2:
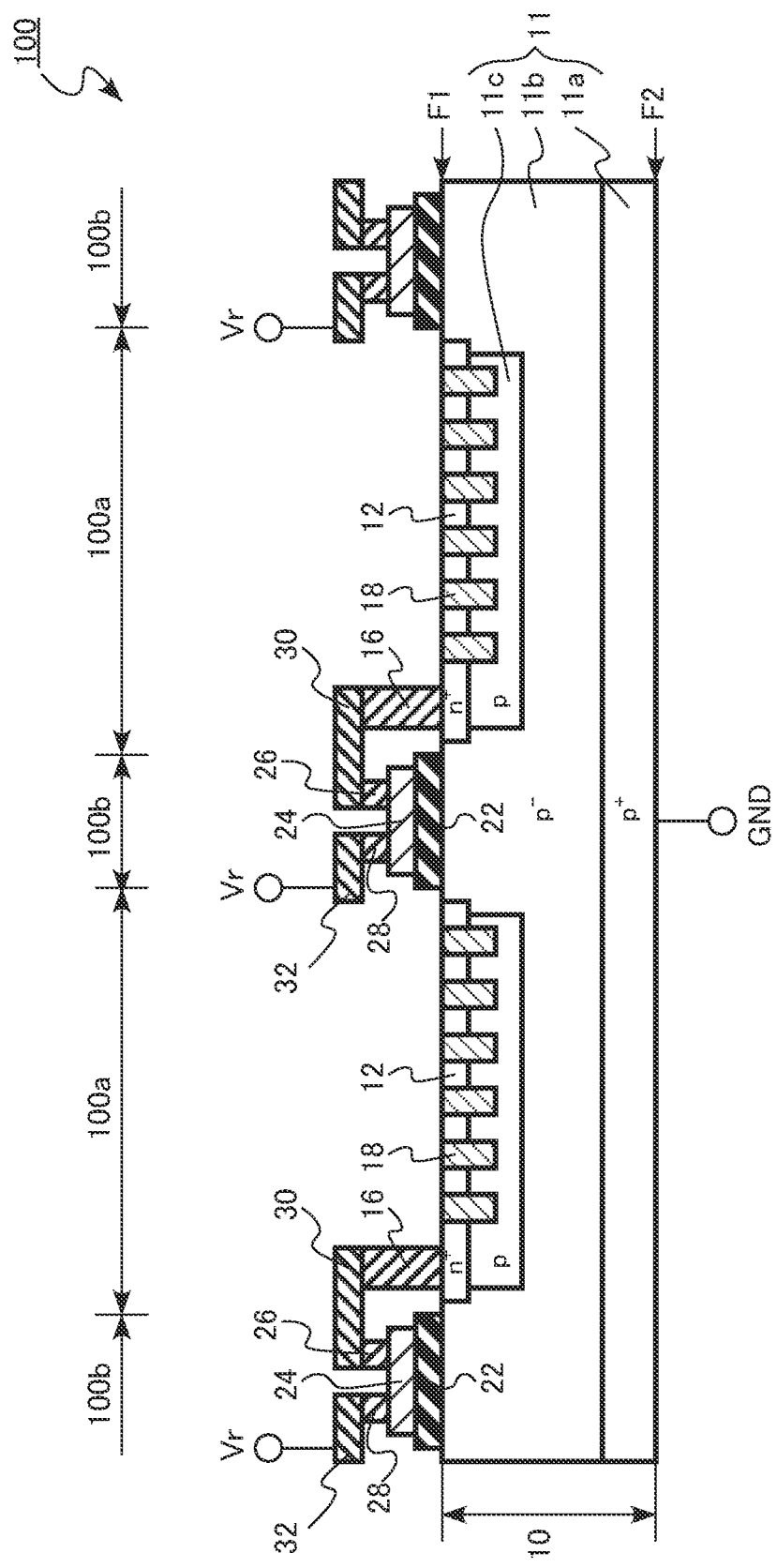
FIG. 2 is a schematic cross-sectional view of the photodetector according to the first embodiment.

FIG. 2 is a schematic cross-sectional view of the photodetector according to the first embodiment. FIG. 2 illustrates a cross section taken along a line AA' in FIG. 1.

The photodetector 100 includes a semiconductor layer 10. The semiconductor layer 10 includes a p-type semiconductor region 11 (first semiconductor region) and an n-type semiconductor region 12 (second semiconductor region). The p-type semiconductor region 11 includes a substrate portion 11a (first portion), a low impurity concentration portion 11b (second portion), and a high impurity concentration portion 11c (third portion).

The photodetector 100 includes a surface electrode 16 (electrode), a metal region 18, an element isolation insulating layer 22 (insulating layer), a resistance layer 24, a first contact portion 26, a second contact portion 28, a first wiring layer 30, and a second wiring layer 32.

The semiconductor layer 10 has a first face (F1 in FIG. 2) and a second face (F2 in FIG. 2). In the following, the first face F1 is also referred to as a front surface. The second face F2 is also referred to as a back surface.

The semiconductor layer 10 is, for example, made of silicon. The semiconductor layer 10 is, for example, made of single crystal silicon.

The cell region 100a includes the semiconductor layer 10. The semiconductor layer 10 in the cell region 100a includes the p-type semiconductor region 11 and the n-type semiconductor region 12.

The p-type semiconductor region 11 in the cell region 100a includes the substrate portion 11a, the low impurity concentration portion 11b, and the high impurity concentration portion 11c.

The substrate portion 11a is a $p^+$-type semiconductor. The substrate portion 11a is provided on the second face F2 side.

For example, a ground electric potential (GND) is applied to the substrate portion 11a.

The low impurity concentration portion 11b is a $p^-$-type semiconductor. The low impurity concentration portion 11b is provided between the substrate portion 11a and the first face F1.

The low impurity concentration portion 11b is, for example, an epitaxial growth layer formed on the substrate portion 11a by an epitaxial growth method. The p-type impurity concentration of the low impurity concentration portion 11b is lower than the p-type impurity concentration of the substrate portion 11a.

The thickness of the low impurity concentration portion 11b in the direction from the first face F1 to the second face F2 is, for example, equal to or more than 1 μm and equal to or less than 5 μm.

The high impurity concentration portion 11c is a p-type semiconductor. The high impurity concentration portion 11c is provided between the low impurity concentration portion 11b and the first face F1. The high impurity concentration portion 11c is provided between the low impurity concentration portion 11b and the n-type semiconductor region 12.

The high impurity concentration portion 11c is formed, for example, by injecting p-type impurities from the front surface of the semiconductor layer 10 by ion implantation. The p-type impurity concentration of the high impurity concentration portion 11c is higher than the p-type impurity concentration of the low impurity concentration portion 11b.

The n-type semiconductor region 12 is an $n^+$-type semiconductor. The n-type semiconductor region 12 is provided between the p-type semiconductor region 11 and the first face F1. The n-type semiconductor region 12 is provided between the high impurity concentration portion 11c and the first face F1.

The thickness of the n-type semiconductor region 12 in a direction from the first face F1 to the second face F2 is, for example, equal to or more than 100 nm and equal to or less than 1 μm.

In the cell region 100a, an APD is formed by the p-type semiconductor region 11 and the n-type semiconductor region 12. In the cell region 100a, the APD is formed by the substrate portion 11a, the low impurity concentration portion 11b, the high impurity concentration portion 11c, and the n-type semiconductor region 12.

The cell region 100a includes the surface electrode 16. The surface electrode 16 is electrically connected to the n-type semiconductor region 12. The surface electrode 16 is in contact with the n-type semiconductor region 12.

The surface electrode 16 is a conductor. The surface electrode 16 is made of, for example, metal.

Figure 3:
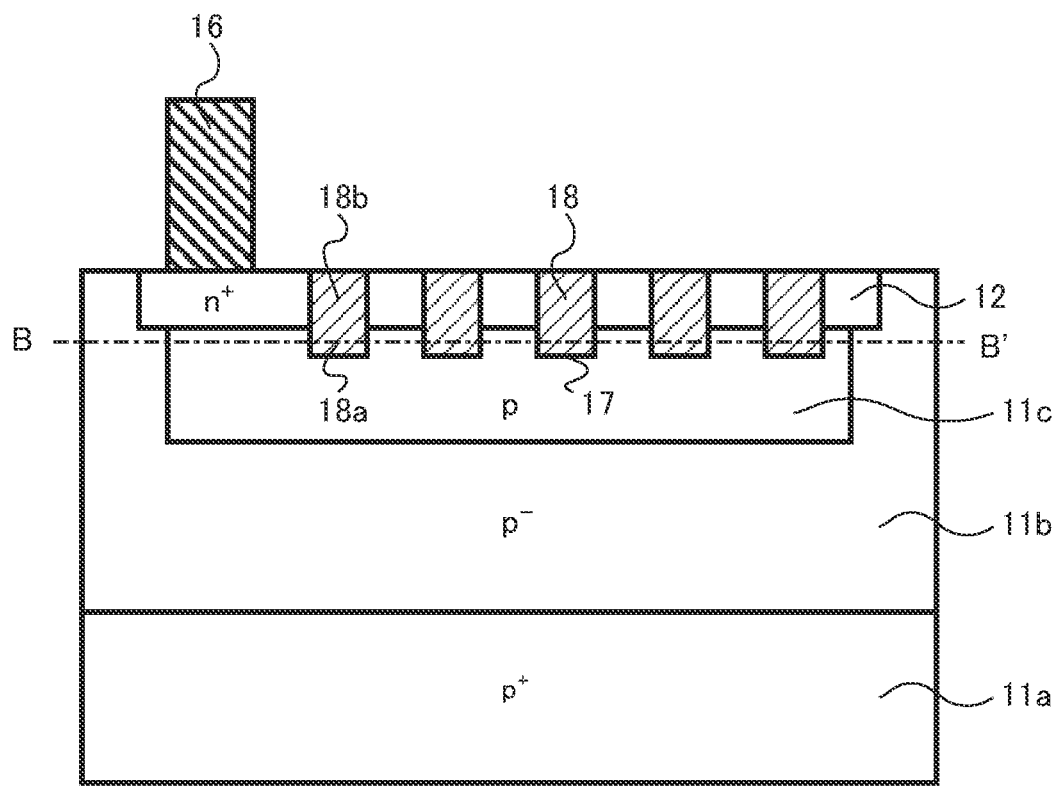
FIG. 3 is an enlarged schematic cross-sectional view of the photodetector according to the first embodiment.

FIG. 3 is an enlarged schematic cross-sectional view of the photodetector according to the first embodiment. FIG. 3 is a cross-sectional view of the cell region 100a. FIG. 3 illustrates a cross section taken along a line CC' in FIG. 4.

Figure 4:
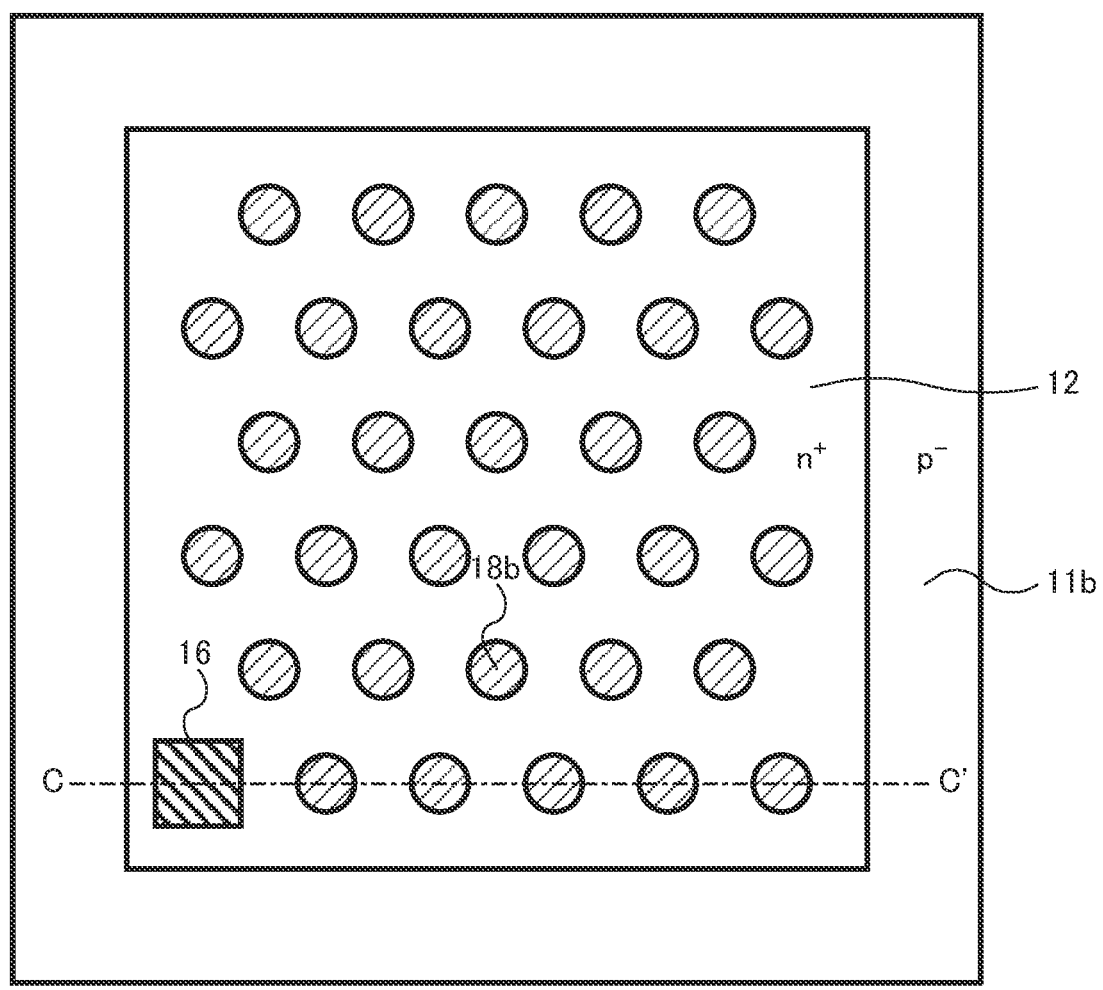
FIG. 4 is an enlarged schematic top view of the photodetector according to the first embodiment.

FIG. 4 is an enlarged schematic top view of the photodetector according to the first embodiment. FIG. 4 is a top view of the first face F1 of the cell region 100a. FIG. 4 is a top view of FIG. 3.

Figure 5:
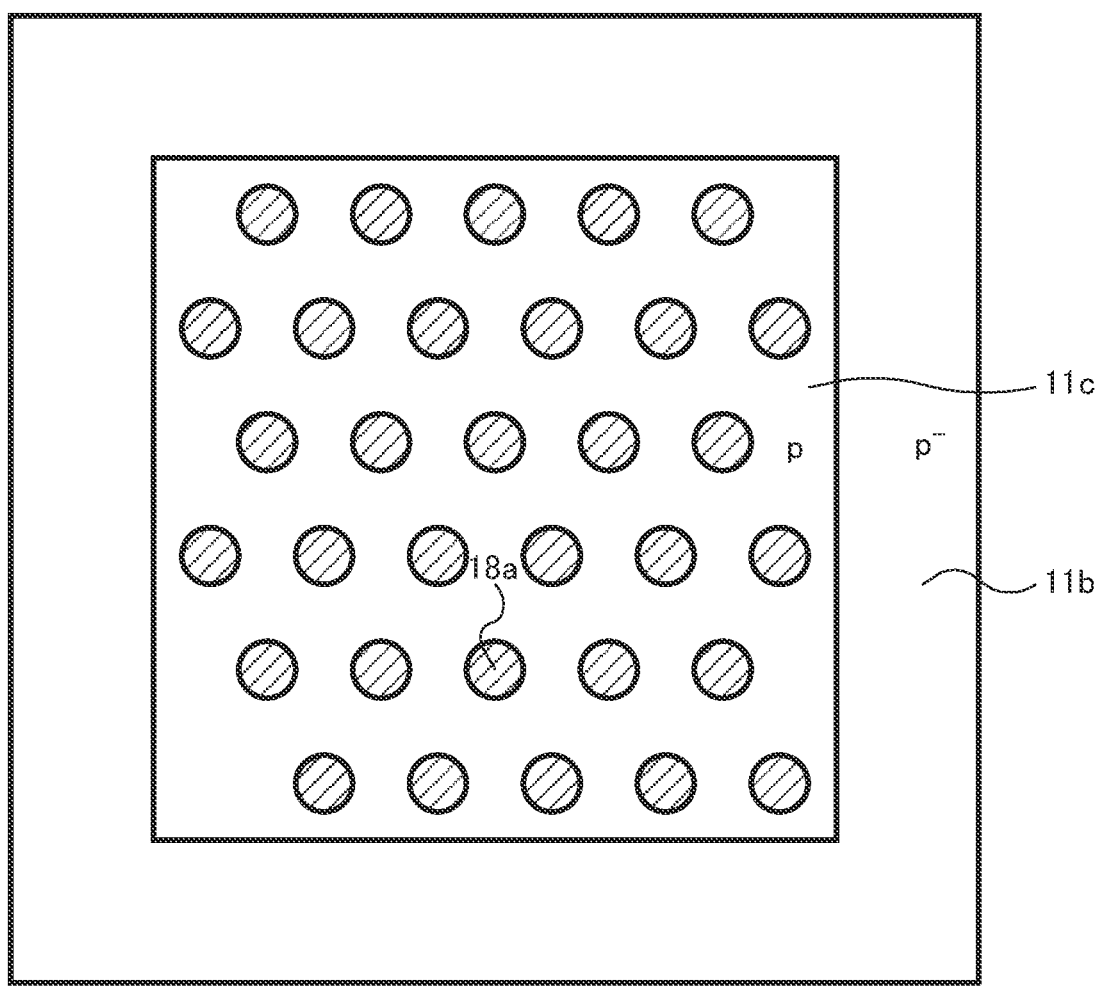
FIG. 5 is an enlarged schematic cross-sectional view of the photodetector according to the first embodiment.

FIG. 5 is an enlarged schematic cross-sectional view of the photodetector according to the first embodiment. FIG. 5 illustrates a cross section taken along a line BB' in FIG. 3. FIG. 5 illustrates a cross section parallel to the first face F1.

The cell region 100a includes a plurality of metal regions 18 on the front surface side of the semiconductor layer 10. The plurality of metal regions 18 is disposed at predetermined intervals on the surface of the semiconductor layer 10.

The metal regions 18 are disposed, for example, in trenches 17 provided in the surface of the semiconductor layer 10. The metal regions 18 are formed by, for example, filling the trenches 17 provided in the surface of the semiconductor layer 10 with metal.

A part of the metal region 18 is surrounded by the p-type semiconductor region 11. Another part of the metal region 18 is surrounded by the n-type semiconductor region 12.

A part of the metal region 18 is surrounded by the p-type semiconductor region 11 in a cross section parallel to the first face F1. Another part of the metal region 18 is surrounded by the n-type semiconductor region 12 in a cross section parallel to the first face F1.

For example, as illustrated in FIG. 5, a lower part 18a of the metal region 18 is surrounded by the p-type semiconductor region 11. The lower part 18a of the metal region 18 is surrounded by the high impurity concentration portion 11c.

For example, an upper part 18b of the metal region 18 is surrounded by the n-type semiconductor region 12 as illustrated in FIG. 4.

The metal region 18 penetrates the n-type semiconductor region 12 and reaches the p-type semiconductor region 11. The metal region 18 penetrates the n-type semiconductor region 12 and reaches the high impurity concentration portion 11c.

The metal region 18 is in contact with the p-type semiconductor region 11. The metal region 18 is in contact with the high impurity concentration portion 11c. The metal region 18 is in contact with the n-type semiconductor region 12.

The junction between the metal region 18 and the p-type semiconductor region 11 is constituted by a Schottky junction, for example. The junction between the metal region 18 and the high impurity concentration portion 11c is constituted by a Schottky junction, for example. The junction between the metal region 18 and the n-type semiconductor region 12 is constituted by a Schottky junction, for example.

The maximum width of the metal region 18 on the first face F1 is, for example, equal to or more than 1 nm and equal to or less than 1 μm. The distance between the adjacent two metal regions 18 on the first face F1 is, for example, equal to or more than 10 nm and equal to or less than 100 nm.

The metal region 18 includes metal. The metal region 18 includes, for example, aluminum (Al), tungsten (W), silver (Ag), copper (Cu), nickel (Ni), gold (Au), titanium (Ti), or cobalt (Co).

Note that, on the first face F1 in the cell region 100a, the n-type semiconductor region 12 is surrounded by the p-type semiconductor region 11. On the first face F1 in the cell region 100a, the n-type semiconductor region 12 is surrounded by, for example, the low impurity concentration portion 11b.

The element isolation region 100b includes the semiconductor layer 10, the element isolation insulating layer 22, and the resistance layer 24.

The element isolation region 100b includes the p-type semiconductor region 11. The element isolation region does not include the n-type semiconductor region 12.

In the element isolation region 100b, the p-type semiconductor region 11 is in contact with the first face F1. In the element isolation region 100b, the low impurity concentration portion 11b is in contact with the first face F1, for example.

The element isolation insulating layer 22 is provided on the first face F1 side of the semiconductor layer 10. The element isolation insulating layer 22 is provided on the front surface of the semiconductor layer 10. The element isolation insulating layer 22 is made of, for example, silicon oxide.

The resistance layer 24 is provided on the element isolation insulating layer 22. The element isolation insulating layer 22 is provided between the semiconductor layer 10 and the resistance layer 24.

The resistivity of the resistance layer 24 is higher than the resistivity of the surface electrode 16.

The resistance layer 24 is made of metal or a semiconductor. The resistance layer 24 is made of, for example, polycrystalline silicon.

The resistance layer 24 is electrically connected to the surface electrode 16. One end of the resistance layer 24 is electrically connected to the surface electrode 16 via the first contact portion 26 and the first wiring layer 30.

In addition, the other end of the resistance layer 24 is electrically connected to the second wiring layer 32 via the second contact portion 28.

The resistivity of the resistance layer 24 is higher than the resistivity of the first contact portion 26, for example. The resistivity of the resistance layer 24 is higher than the resistivity of the second contact portion 28, for example. The resistivity of the resistance layer 24 is higher than the resistivity of the first wiring layer 30, for example. The resistivity of the resistance layer 24 is higher than the resistivity of the second wiring layer 32, for example.

A positive power supply electric potential Vr is applied to the second wiring layer 32, for example. The positive power supply electric potential Vr is applied to the surface electrode 16, for example.

Next, functions and effects of the photodetector 100 according to the first embodiment will be described.

Figure 6:
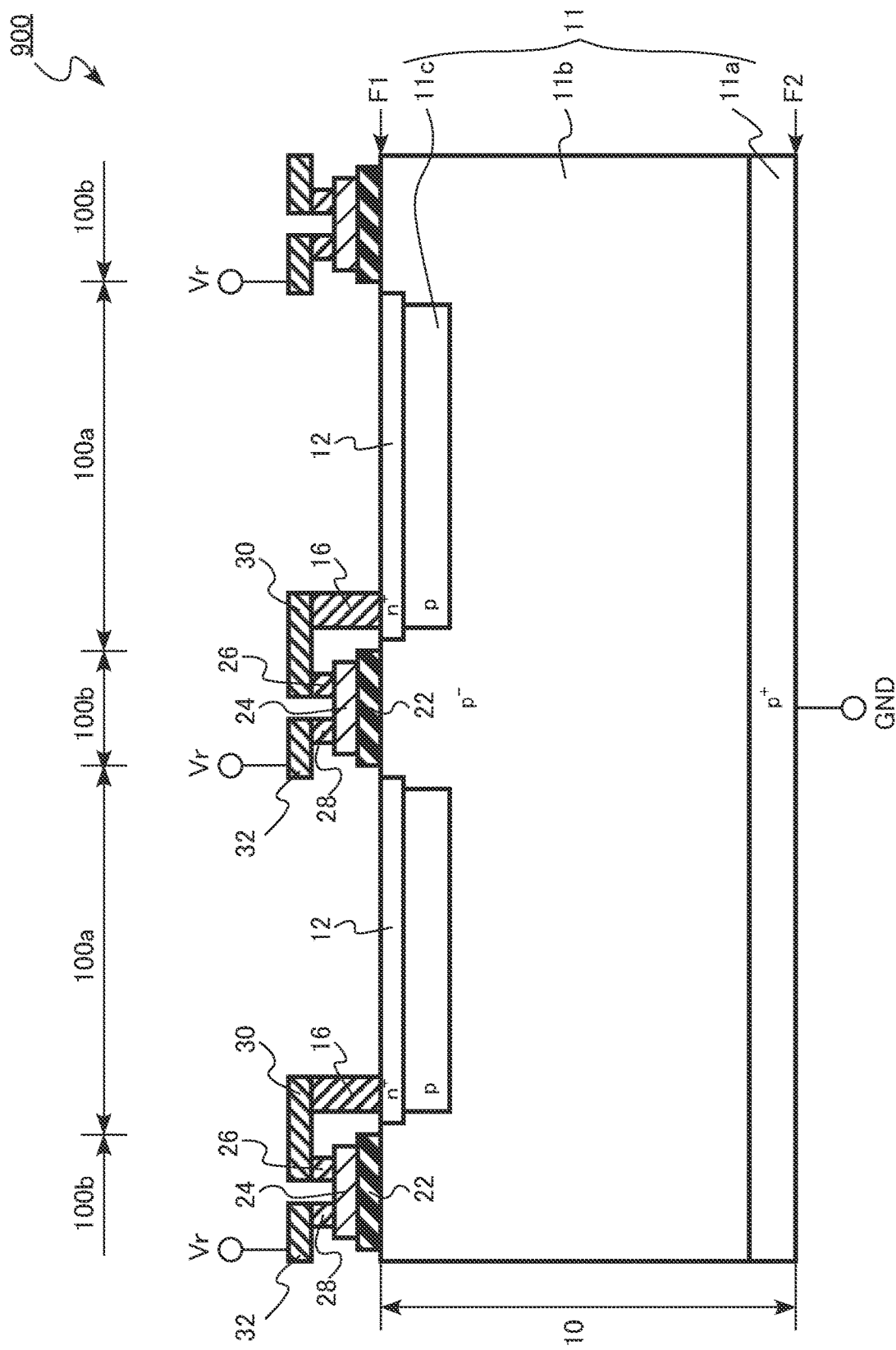
FIG. 6 is a schematic cross-sectional view of a photodetector according to a comparative example.

FIG. 6 is a schematic cross-sectional view of a photodetector according to a comparative example. A photodetector 900 according to the comparative example is similar to the photodetector 100 according to the first embodiment in being a SiPM provided with a plurality of APDs. FIG. 6 is a diagram corresponding to FIG. 2 of the first embodiment.

The photodetector 900 according to the comparative example is different from the photodetector 100 according to the first embodiment in not having the metal region 18 in the cell region 100a. The photodetector 900 according to the comparative example is also different from the photodetector 100 according to the first embodiment in that the low impurity concentration portion 11b is thick.

The operation of the SiPM provided with the plurality of APDs will be described below with reference to the photodetector 900 according to the comparative example.

Figure 7:
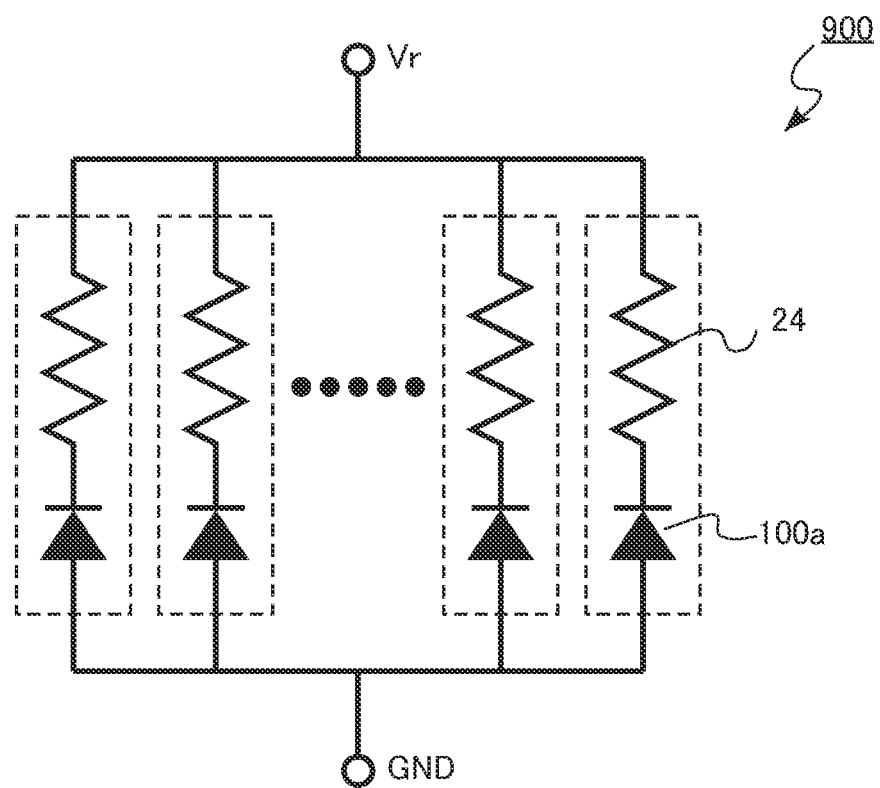
FIG. 7 is an equivalent circuit diagram of the photodetector according to the comparative example.

FIG. 7 is an equivalent circuit diagram of the photodetector according to the comparative example. FIG. 7 is also an equivalent circuit diagram of the photodetector according to the first embodiment.

Each cell region 100a constitutes one APD. In addition, one resistance layer 24 is connected in series to the APD of each cell region 100a. In the photodetector 900, a plurality of APDs each being connected in series with the resistance layer 24 is connected in parallel.

As illustrated in FIG. 6, a ground electric potential (GND) is applied to the substrate portion 11a, and a positive power supply voltage (Vr) is applied to the second wiring layer 32, so that a reverse bias voltage is applied to the APD.

A depletion layer extends to the semiconductor layer 10 across the pn junction between the n-type semiconductor region 12 and the p-type semiconductor region 11 of the APD. In particular, the depletion layer extends to the low impurity concentration portion 11b having a low p-type impurity concentration. The low impurity concentration portion 11b functions as a light absorbing layer that absorbs photons.

For example, when photons are incident on the depletion layer in the cell region 100a, electron-hole pairs are generated. For example, the generated electrons and holes flow toward the pn junction and are accelerated by an amplification layer having a steep electric potential gradient at the pn junction interface, causing an electron avalanche. The current flowing through the APD is amplified by the occurrence of electron avalanche, and thus, the incidence of one photon can be detected in one cell region 100a, for example.

The photodetector 900 has a plurality of cell regions 100a which is connected in parallel as illustrated in FIG. 7, so that it can count the number of simultaneously incident photons.

The resistance layer 24 connected to each cell region 100a functions as a so-called quenching resistor. The quenching resistor has a function of quenching the electron avalanche generated by the APD by a voltage drop.

The photodetector 900 has high detection sensitivity, and thus, is required to suppress generation of noise. The noise to be suppressed includes crosstalk noise and delay noise.

The crosstalk noise is generated, for example, when a secondary photon generated by an electron avalanche enters the adjacent cell region 100a. From the viewpoint of improving the detection sensitivity of the photodetector 900, it is preferable that a depletion layer is formed, and the thickness of the low impurity concentration portion 11b functioning as a light absorption layer is increased. However, when the thickness of the low impurity concentration portion 11b is increased, secondary photons are likely to be incident on the adjacent cell region 100a, so that crosstalk noise may increase.

In addition, the delay noise is generated when carriers remaining in the low impurity concentration portion 11b cause an electron avalanche after a lapse of time. When the thickness of the low impurity concentration portion 11b is increased, the number of remaining carriers increases, so that the delay noise may increase.

Therefore, from the viewpoint of suppressing noise, it is desirable to reduce the thickness of the low impurity concentration portion 11b functioning as the light absorbing layer with high detection sensitivity of the photodetector 900 being maintained.

In the photodetector 100 according to the first embodiment, the cell region 100a includes the metal regions 18. The photodetector 100 includes the metal regions 18 in the cell region 100a, and thus can achieve high detection sensitivity.

Therefore, it is possible to reduce the thickness of the low impurity concentration portion 11b while maintaining high detection sensitivity. Accordingly, noise of the photodetector 100 can be suppressed. This will be described in detail below.

Figure 8A:
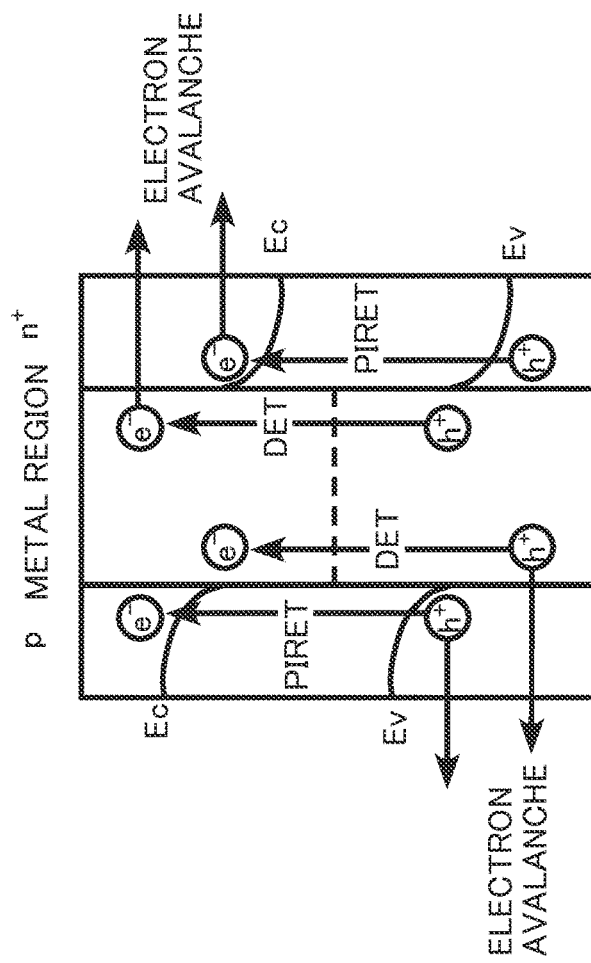
FIGS. 8A and 8B are explanatory diagrams for describing functions and effects of the photodetector according to the first embodiment.
Figure 8B:
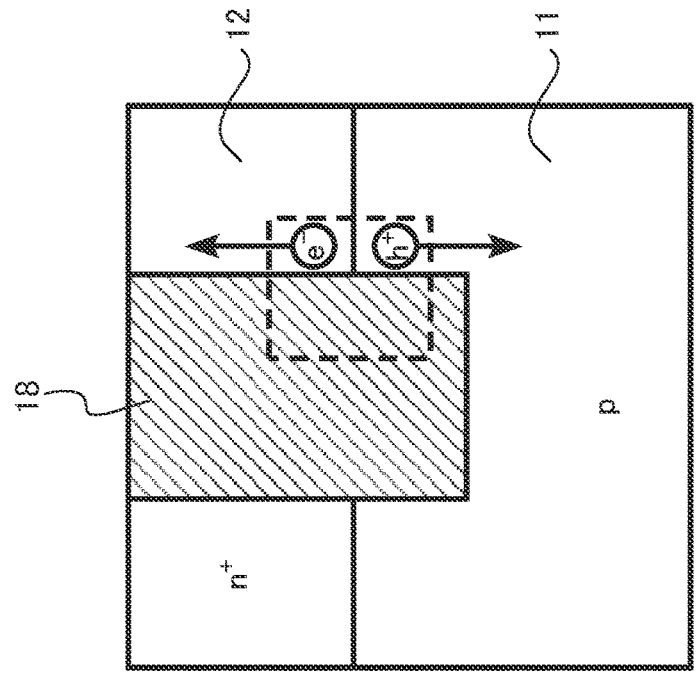

FIGS. 8A and 8B are explanatory diagrams for describing functions and effects of the photodetector according to the first embodiment. FIG. 8A is a cross-sectional view of a portion including the metal region 18. FIG. 8B is a band diagram of a region enclosed by a dotted rectangle in FIG. 8A.

A metal structure in the order of several nm to several hundred nm exhibits extremely large absorption characteristics for light having a wavelength corresponding to the metal type, size, shape, and the like of the metal structure. This is because light is localized in the metal structure by resonance between free electrons in the metal and incident light. This resonance state is called plasmon.

The metal and the semiconductor close to each other largely interact with each other in the following two processes.

The first process is plasmon-induced resonance energy transfer (PIRET). The enhanced electric field generated in the vicinity of the metal structure by plasmon behaves such that incident light is confined and localized in the metal structure. The localized light induces photoexcitation between the band gaps within the proximate semiconductor.

The light localized in the metal structure makes it possible to remarkably improve the photoexcitation probability at the pn junction. As illustrated in FIG. 8B, both electrons and holes in the carrier generated in the amplification layer by PIRET are accelerated according to an electric potential gradient, and contribute to an electron avalanche.

The second process is direct energy transfer (DET). Light localized in the metal structure forms electron-hole pairs in the metal in the deactivation process. At this time, when the metal structure and the semiconductor form a Schottky junction, carriers are injected into the semiconductor with a fixed probability.

As illustrated in FIG. 8B, electron-hole pairs excited in the metal structure are injected into the semiconductor layer beyond the Schottky barrier. Electrons and holes injected into the semiconductor layer are accelerated according to an electric potential gradient, and contribute to an electron avalanche.

According to the principle described above, the light absorption sensitivity of the photodetector 100 is remarkably improved by the interaction between the metal regions 18 and the semiconductor layer 10. Therefore, the detection sensitivity of the photodetector 100 is remarkably improved. Therefore, it is possible to reduce the thickness of the low impurity concentration portion 11b while maintaining high detection sensitivity. Accordingly, noise of the photodetector 100 can be suppressed.

From the viewpoint of achieving the effect by the DET, a Schottky junction is preferably used for the junction between the metal regions 18 and the p-type semiconductor region 11. In addition, the Schottky junction is preferably used for the junction between the metal regions 18 and the n-type semiconductor region 12.

When the semiconductor layer 10 is made of silicon, the metal of the metal regions 18 is preferably aluminum (Al), tungsten (W), silver (Ag), copper (Cu), nickel (Ni), or gold (Au) from the viewpoint of achieving the Schottky junction.

Modification

Figure 9:
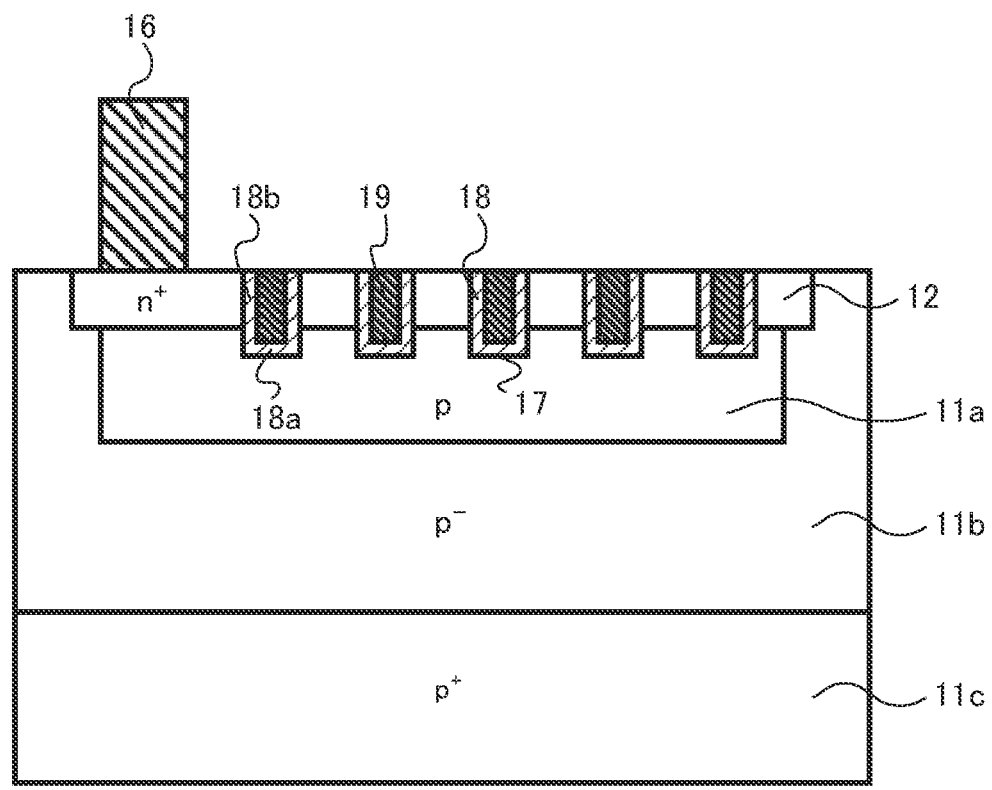
FIG. 9 is an enlarged schematic cross-sectional view of a photodetector according to a modification of the first embodiment.

FIG. 9 is an enlarged schematic cross-sectional view of a photodetector according to a modification of the first embodiment. FIG. 9 is a diagram corresponding to FIG. 3 of the first embodiment. FIG. 9 illustrates a cross section taken along a line CC' in FIG. 10.

Figure 10:
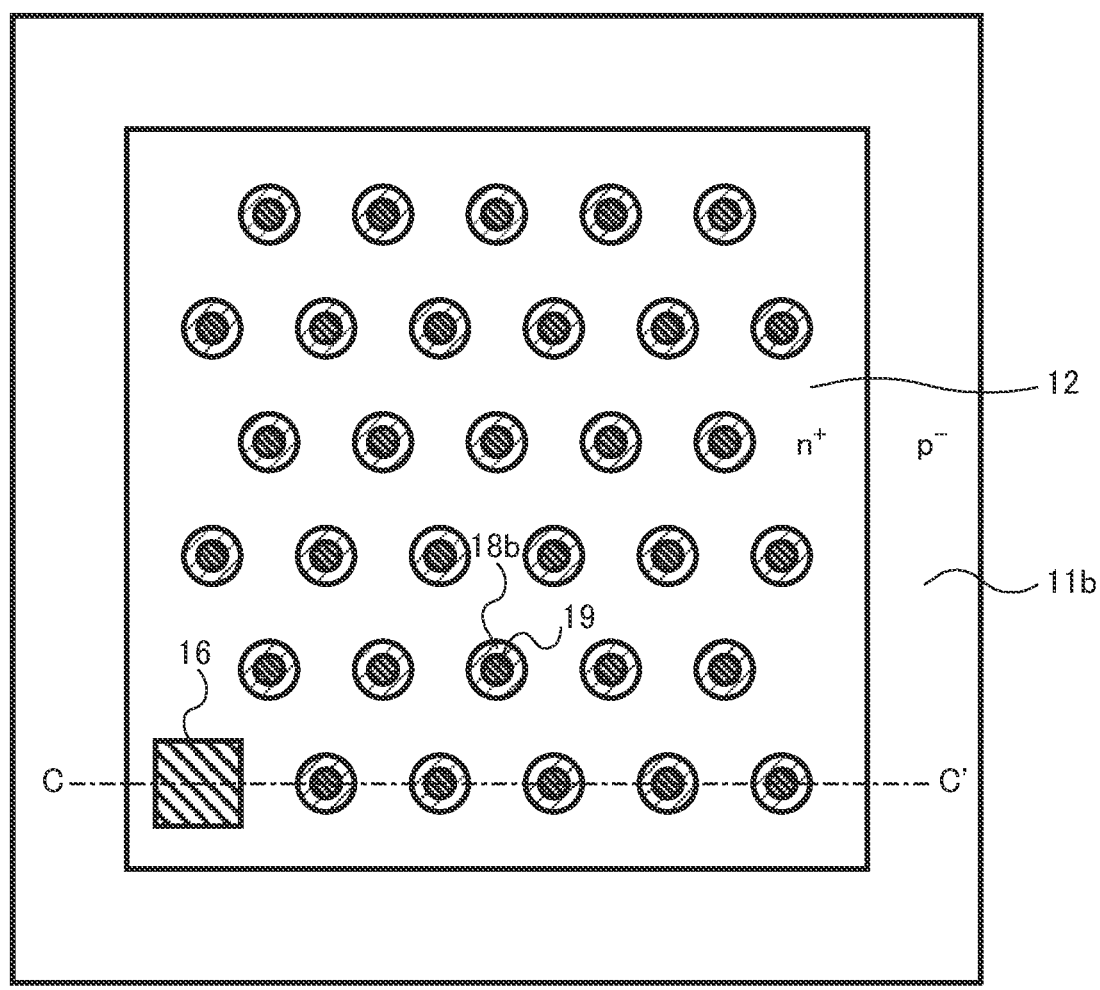
FIG. 10 is an enlarged schematic top view of the photodetector according to the modification of the first embodiment.

FIG. 10 is an enlarged schematic top view of the photodetector according to the modification of the first embodiment. FIG. 10 is a top view of the first face F1 of the cell region 100a. FIG. 10 is a top view of FIG. 9.

The photodetector according to the modification of the first embodiment is different from the photodetector 100 according to the first embodiment in that the cell region 100a further includes an insulating region 19 surrounded by the metal region 18.

In the cross section parallel to the first face F1, the insulating region 19 is surrounded by the metal region 18. The insulating region 19 is made of, for example, silicon oxide.

The metal region 18 is formed of, for example, a metal thin film. For example, trenches 17 provided in the semiconductor layer 10 are filled with metal thin films, and then, portions inside the metal thin films are filled with insulators.

Thus, the structure of the cell region 100a illustrated in FIGS. 9 and 10 can be formed.

The photodetector according to the modification of the first embodiment can also provide the same effects as those of the photodetector 100 according to the first embodiment.

As described above, according to the first embodiment and the modification, a photodetector capable of suppressing noise can be achieved.

Second Embodiment

A photodetector according to the second embodiment is different from the photodetector according to the first embodiment in that the cell region further includes an insulating film provided between the metal region and the first semiconductor region and between the metal region and the second semiconductor region. In the following, the description overlapping the description of the first embodiment may be partially omitted.

The photodetector according to the second embodiment is an SiPM provided with a plurality of APDs as in the first embodiment.

Figure 11:
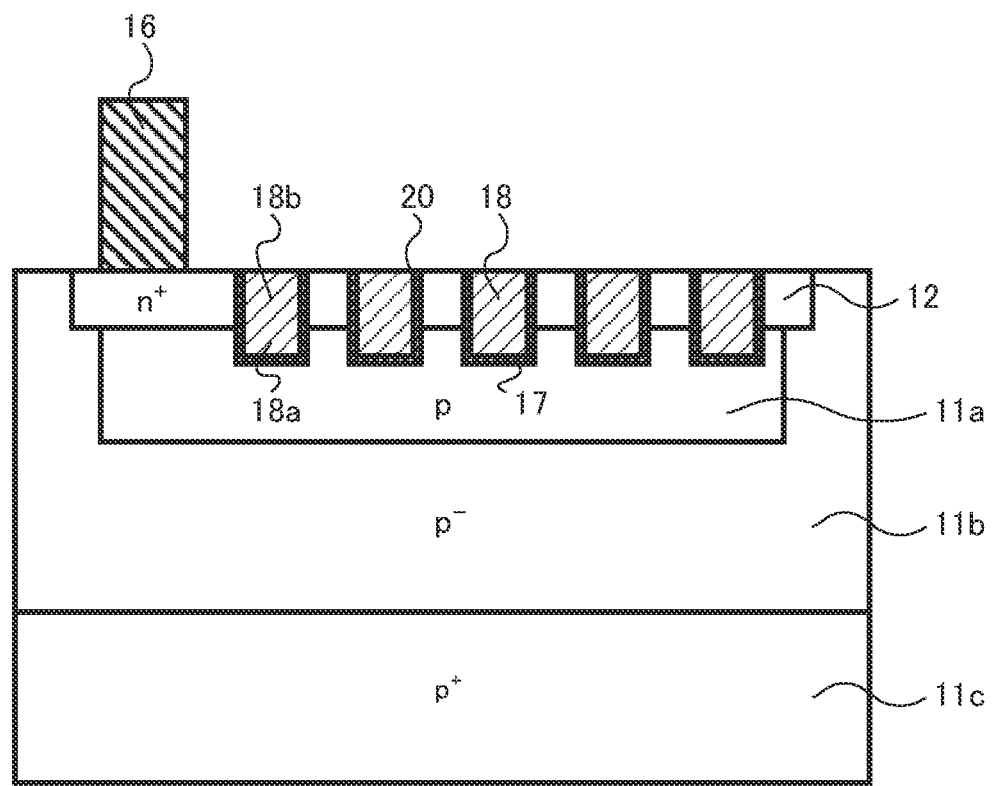
FIG. 11 is an enlarged schematic cross-sectional view of a photodetector according to a second embodiment.

FIG. 11 is an enlarged schematic cross-sectional view of the photodetector according to the second embodiment. FIG. 11 is a diagram corresponding to FIG. 3 of the first embodiment. FIG. 11 illustrates a cross section taken along a line CC' in FIG. 12.

Figure 12:
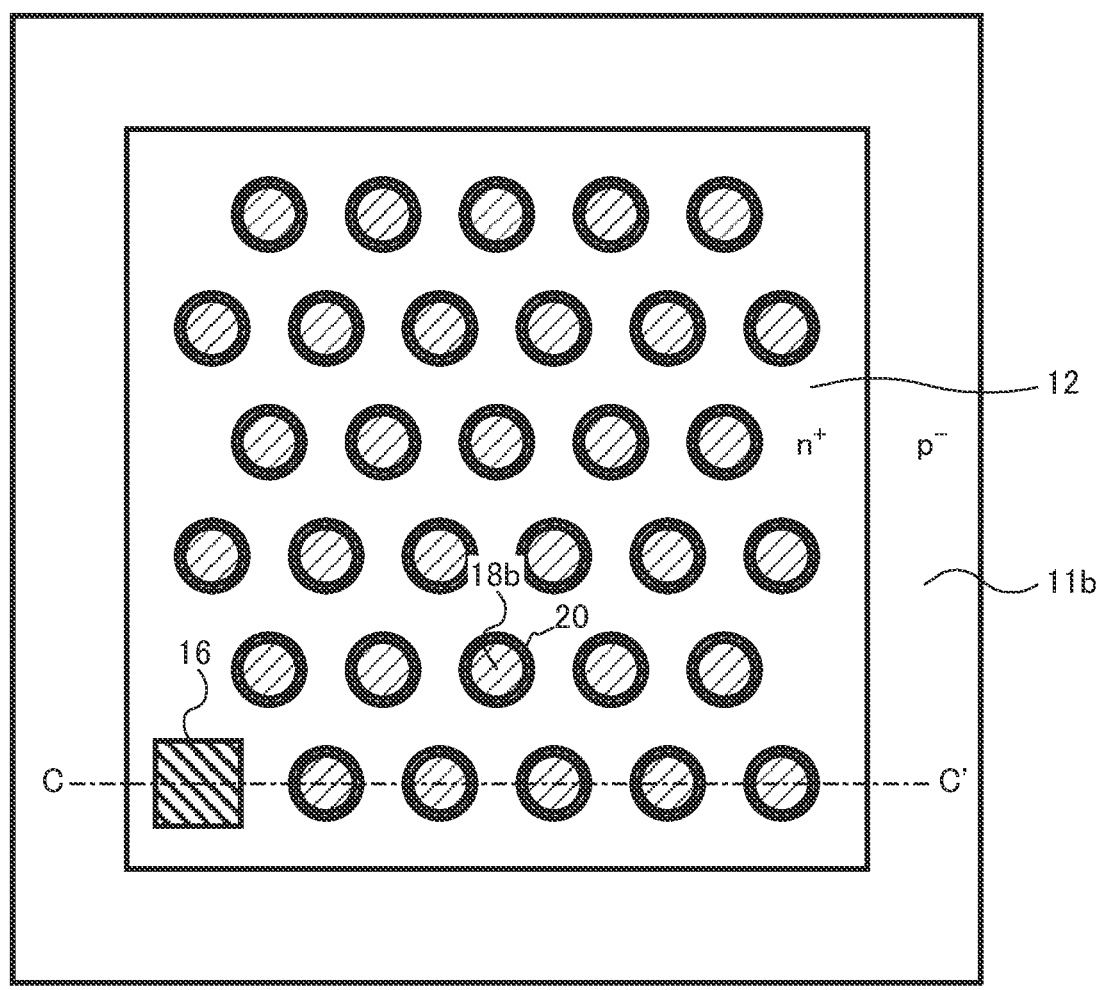
FIG. 12 is an enlarged schematic top view of the photodetector according to the second embodiment.

FIG. 12 is an enlarged schematic top view of the photodetector according to the second embodiment. FIG. 12 is a top view of a first face F1 of a cell region 100a. FIG. 12 is a top view of FIG. 11.

In the photodetector according to the second embodiment, the cell region 100a includes an insulating film 20. The insulating film 20 is provided between the metal region 18 and the p-type semiconductor region 11 and between the metal region 18 and the n-type semiconductor region 12. The insulating film 20 is made of, for example, silicon oxide.

For example, the insulating film 20 is formed by thermal oxidation in a trench 17 provided in the semiconductor layer 10. Thereafter, the inside of the insulating film 20 is filled with metal, whereby the structure of the cell region 100a illustrated in FIGS. 11 and 12 can be formed.

In the photodetector according to the second embodiment, the metal region 18 is not in contact with the semiconductor layer 10, and therefore, the effect by the DET cannot be obtained. However, the effect of PIRET can be obtained as in the photodetector 100 according to the first embodiment. Accordingly, noise of the photodetector can be suppressed.

As described above, according to the second embodiment, a photodetector capable of suppressing noise can be achieved.

Third Embodiment

A photodetector according to the third embodiment includes a plurality of cell regions disposed in an array, and an element isolation region provided between the cell regions, each of the cell regions including: a semiconductor layer having a first face and a second face opposite to the first face; a first semiconductor region of a first conductivity type provided in the semiconductor layer; a second semiconductor region of a second conductivity type provided between the first semiconductor region and the first face; an electrode in contact with the second semiconductor region; and a plurality of metal regions provided on the first face side of the semiconductor layer, the second semiconductor region being provided between the first semiconductor region and the metal regions.

The photodetector according to the third embodiment is different from the photodetector according to the first embodiment in that the second semiconductor region is provided between the metal region and the first semiconductor region. In the following, the description overlapping the description of the first embodiment may be partially omitted.

The photodetector according to the third embodiment is an SiPM provided with a plurality of APDs as in the first embodiment.

Figure 13:
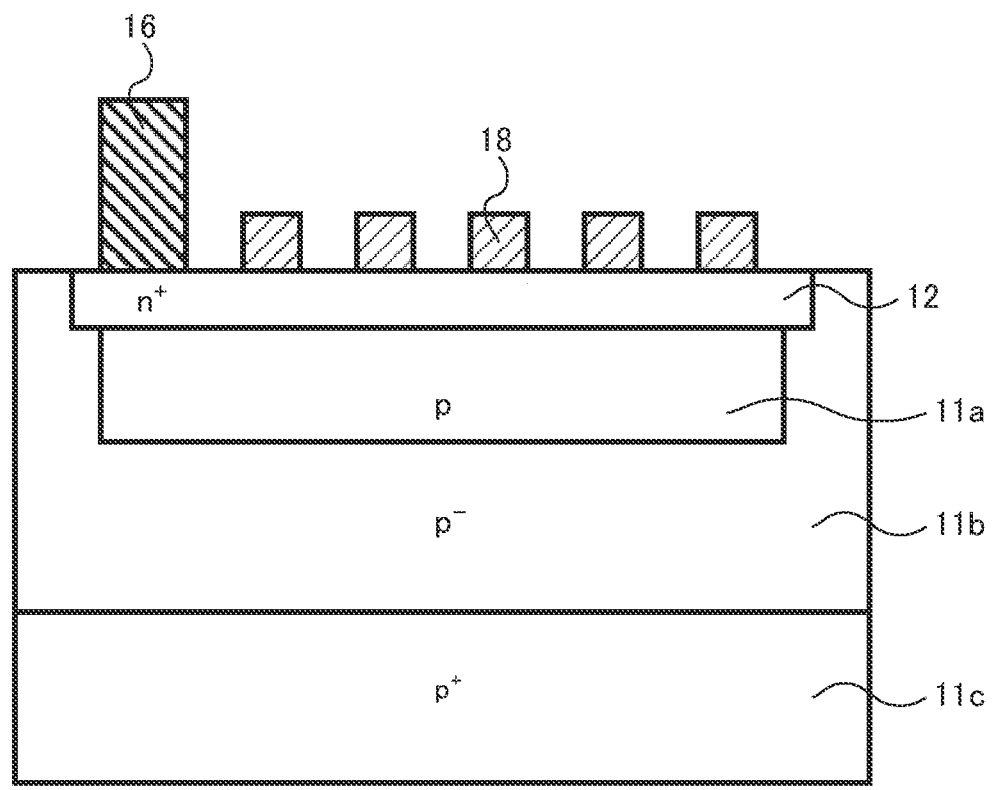
FIG. 13 is an enlarged schematic cross-sectional view of a photodetector according to a third embodiment.

FIG. 13 is an enlarged schematic cross-sectional view of the photodetector according to the third embodiment. FIG. 13 is a diagram corresponding to FIG. 3 of the first embodiment. FIG. 13 illustrates a cross section taken along a line CC' in FIG. 14.

Figure 14:
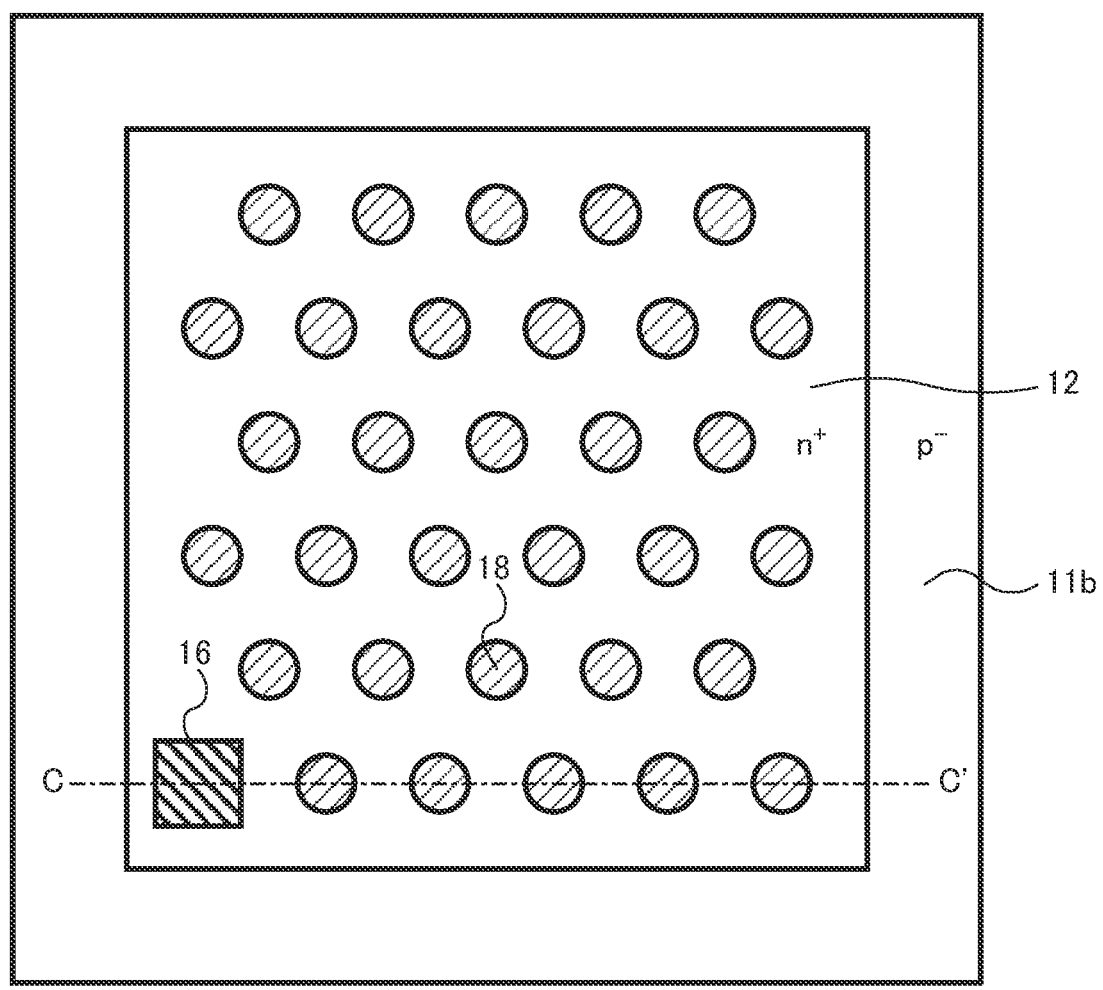
FIG. 14 is an enlarged schematic top view of the photodetector according to the third embodiment.

FIG. 14 is an enlarged schematic top view of the photodetector according to the third embodiment. FIG. 14 is a top view of a first face F1 of a cell region 100a. FIG. 14 is a top view of FIG. 13.

In the photodetector according to the third embodiment, a metal region 18 is provided on the first face F1 side of the semiconductor layer 10. The metal region 18 is provided on the first face F1. The metal region 18 is provided on an n-type semiconductor region 12. The metal region 18 is in contact with the n-type semiconductor region 12.

The n-type semiconductor region 12 is provided between the metal region 18 and a p-type semiconductor region 11. The metal region 18 and the p-type semiconductor region 11 are spaced from each other in a direction from a second face F2 toward the first face F1.

The junction between the metal region 18 and the n-type semiconductor region 12 is constituted by a Schottky junction, for example.

The photodetector according to the third embodiment can provide the effects of DET and PIRET. Therefore, it is possible to reduce the thickness of the low impurity concentration portion 11b while maintaining high detection sensitivity. Accordingly, noise of the photodetector can be suppressed.

As described above, according to the third embodiment, a photodetector capable of suppressing noise can be achieved.

Fourth Embodiment

The photodetector according to the fourth embodiment is different from the photodetector according to the third embodiment in further including an insulating film provided between a metal region and a second semiconductor region. In the following, the description overlapping the description of the first embodiment or the third embodiment may be partially omitted.

The photodetector according to the fourth embodiment is an SiPM provided with a plurality of APDs as in the third embodiment.

Figure 15:
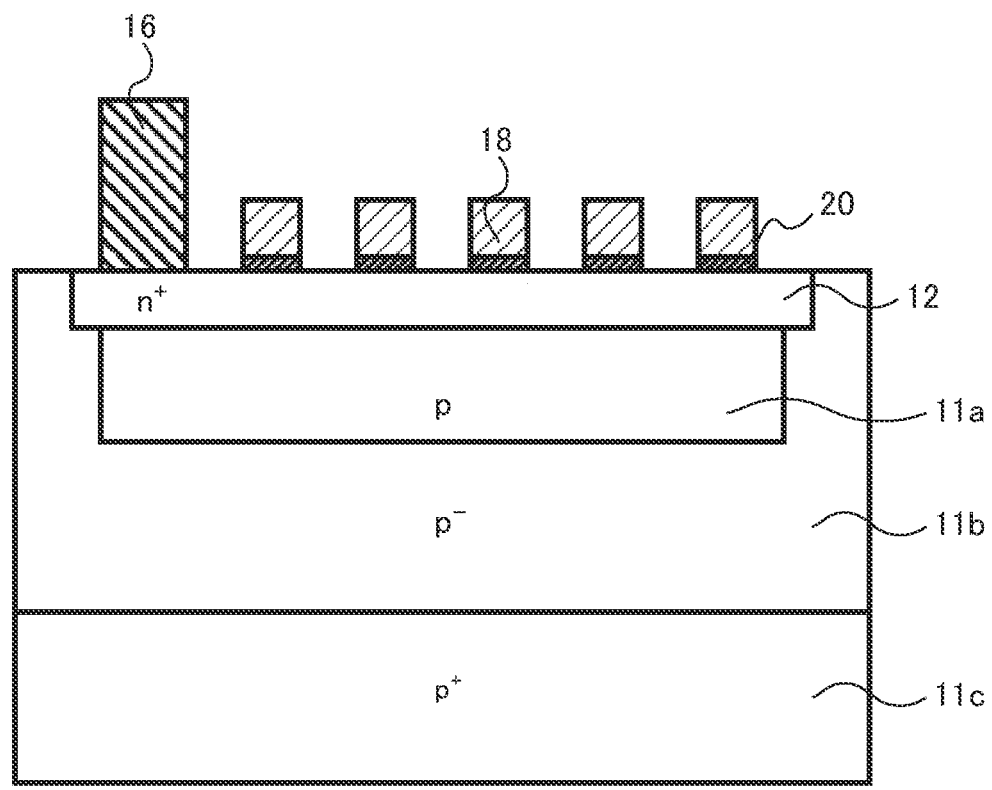
FIG. 15 is an enlarged schematic cross-sectional view of a photodetector according to a fourth embodiment.

FIG. 15 is an enlarged schematic cross-sectional view of the photodetector according to the fourth embodiment. FIG. 15 is a diagram corresponding to FIG. 13 of the third embodiment.

In the photodetector according to the fourth embodiment, a cell region 100a includes an insulating film 20. The insulating film 20 is provided between a metal region 18 and an n-type semiconductor region 12. The insulating film 20 is made of, for example, silicon oxide.

In the photodetector according to the fourth embodiment, the metal region 18 is not in contact with a semiconductor layer 10, and therefore, the effect by the DET cannot be obtained. However, the effect of PIRET can be obtained as in the photodetector according to the third embodiment. Accordingly, noise of the photodetector can be suppressed.

As described above, according to the fourth embodiment, a photodetector capable of suppressing noise can be achieved.

The first to fourth embodiments have described, as an example, the case where the first conductivity type is p-type and the second conductivity type is n-type. However, the first conductivity type may be n-type and the second conductivity type may be p-type. In that case, a positive power supply electric potential Vr is applied to the substrate portion 11a, for example. Furthermore, a ground electric potential (GND) is applied to the second wiring layer 32, for example.

The first to fourth embodiments have described, as an example, the case where the semiconductor layer 10 is made of silicon. However, the semiconductor layer 10 may include semiconductor made of silicon oxide (SiC), or the like other than silicon.

While certain embodiments have been described, these embodiments have been presented by way of example only, and are not intended to limit the scope of the inventions. Indeed, the photodetector described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A photodetector comprising:
a plurality of cell regions disposed in an array; and
an element isolation region provided between the cell regions,
each of the cell regions including:
a semiconductor layer having a first face and a second face opposite to the first face;
a first semiconductor region of a first conductivity type provided in the semiconductor layer;
a second semiconductor region of a second conductivity type provided between the first semiconductor region and the first face;
an electrode in contact with the second semiconductor region; and
a plurality of metal regions each of which has a part surrounded by the first semiconductor region and another part surrounded by the second semiconductor region within one of the cell regions, the plurality of metal regions being surrounded by the element isolation region.

2. The photodetector according to claim 1, wherein each of the metal regions is in contact with the first semiconductor region, and in contact with the second semiconductor region.

3. The photodetector according to claim 2, wherein a junction between each of the metal regions and the first semiconductor region is a Schottky junction and a junction between each of the metal regions and the second semiconductor region is a Schottky junction.

4. The photodetector according to claim 1, wherein each of the cell regions further includes a plurality of insulating regions surrounded by the plurality of metal regions, respectively.

5. The photodetector according to claim 1, wherein each of the cell regions further includes an insulating film provided between each of the metal regions and the first semiconductor region and between each of the metal regions and the second semiconductor region.

6. The photodetector according to claim 1, wherein the element isolation region includes:
the semiconductor layer;
an insulating layer provided on a side of the first face with respect to the semiconductor layer; and
a resistance layer electrically connected to the electrode, the insulating layer being provided between the resistance layer and the semiconductor layer.

7. A photodetector comprising:
a plurality of cell regions disposed in an array; and
an element isolation region provided between the cell regions,
each of the cell regions including:
a semiconductor layer having a first face and a second face opposite to the first face;
a first semiconductor region of a first conductivity type provided in the semiconductor layer;
a second semiconductor region of a second conductivity type provided between the first semiconductor region and the first face;
an electrode in contact with the second semiconductor region; and
a plurality of metal regions provided on a side of the first face of the semiconductor layer within the cell regions, the second semiconductor region being provided between the metal regions and the first semiconductor region, the plurality of metal regions being surrounded by the element isolation region.

8. The photodetector according to claim 7, wherein each of the metal regions is in contact with the second semiconductor region.

9. The photodetector according to claim 7, wherein each of the cell regions further includes a plurality of insulating films provided between the plurality of metal regions, respectively, and the second semiconductor region.

10. The photodetector according to claim 7, wherein the element isolation region includes:
the semiconductor layer;
an insulating layer provided on a side of the first face with respect to the semiconductor layer; and
a resistance layer electrically connected to the electrode, the insulating layer being provided between the resistance layer and the semiconductor layer.

* * * * *